US005907357A

United States Patent [19]

Maki

[11] Patent Number: 5,907,357

[45] Date of Patent: May 25, 1999

[54] SWITCHING CIRCUIT AND CHARGE TRANSFER DEVICE USING SAME

[75] Inventor: Yasuhito Maki, Kanagawa, Japan

[73] Assignee: Sony Corporation, Tokyo, Japan

[21] Appl. No.: 08/617,565

[22] Filed: Mar. 19, 1996

[30] Foreign Application Priority Data

Mar. 20, 1995 [JP] Japan .................................... 7-060341

[51] Int. Cl.[6] .............................. H04N 3/14; H04N 5/335

[52] U.S. Cl. ........................... 348/312; 348/241; 348/324

[58] Field of Search .................................... 348/312, 314, 348/241, 250, 322, 324, 294; 377/71, 68; 327/310, 379, 380, 381, 311, 384, 558; 326/26, 27

[56] References Cited

U.S. PATENT DOCUMENTS

| | | | |
|---|---|---|---|
| 4,999,676 | 3/1991 | Mouri | 355/246 |
| 5,623,221 | 4/1997 | Miyake | 327/108 |

*Primary Examiner*—Wendy Garber
*Assistant Examiner*—Christopher Onuaku
*Attorney, Agent, or Firm*—Hill & Simpson

[57] ABSTRACT

A switching circuit comprising a means for holding a signal or a DC component thereof, and a switching transistor for driving the holding means, wherein another means is included for shaping the trailing edge to be more obtuse in the fall of a driving pulse applied to a gate of the switching transistor. There is also disclosed a charge transfer device comprising a charge transferrer for transferring a signal charge, a charge-voltage converter for converting the transferred signal charge into a proportional voltage, and a driver for supplying a reset pulse to the charge-voltage converter so as to reset the capacitance thereof to a predetermined potential, wherein another a means is incorporated in the driver for shaping the trailing edge to be more obtuse in the fall of the reset pulse. Since the trailing edge of the reset pulse at the time of turning off the reset is rendered more obtuse, it becomes possible to reduce the coupling portion of the output waveform where the potential of a floating diffusion or a floating gate is varied by the capacitive coupling which is derived from the parasitic capacitance between a reset drain and a reset gate.

8 Claims, 17 Drawing Sheets

F I G. 6
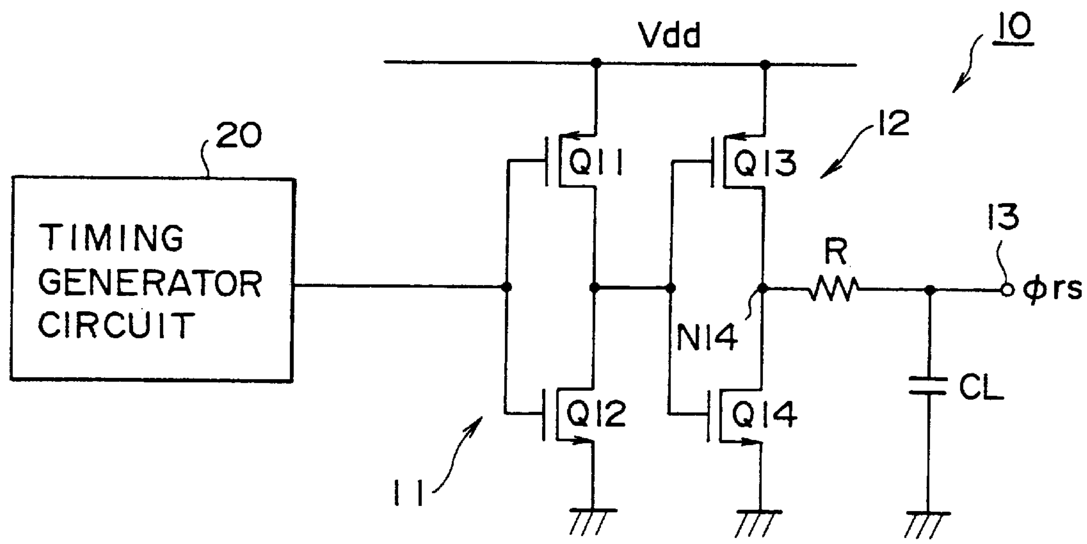
F I G. 7
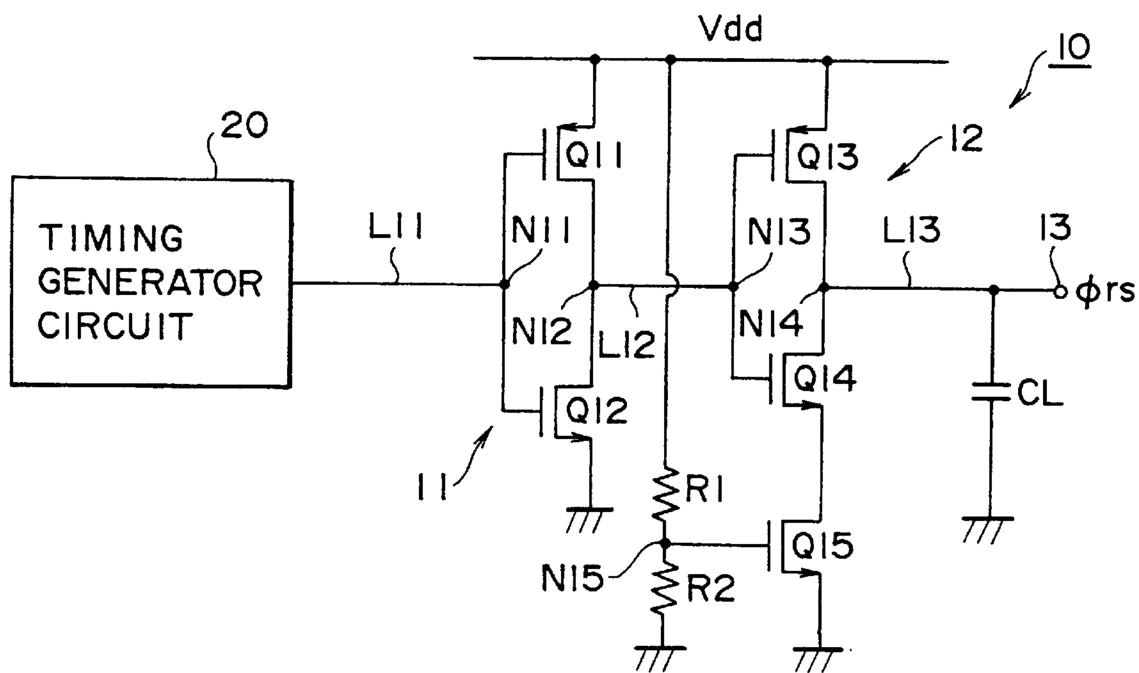

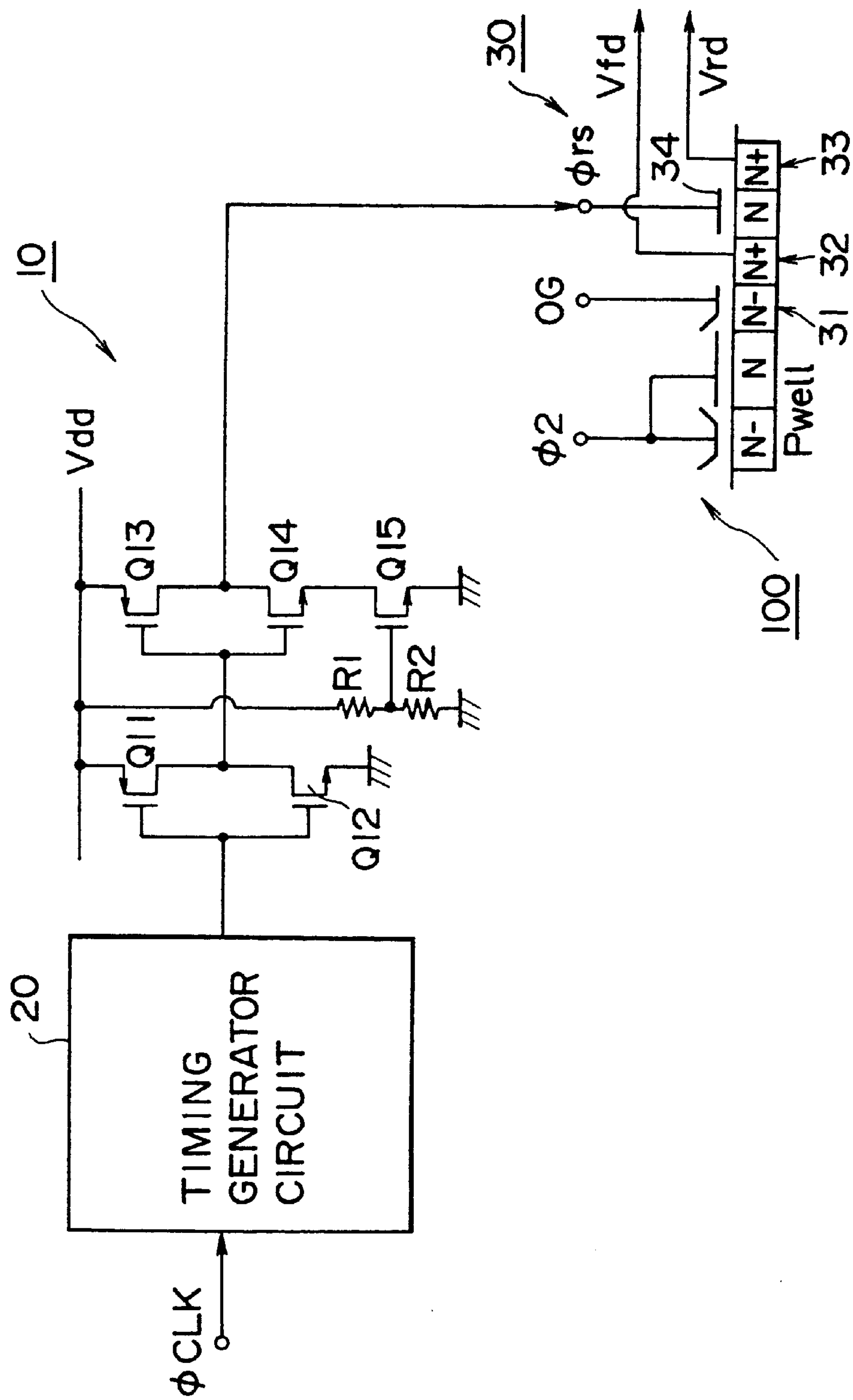
F I G. 8
10
20
TIMING GENERATOR CIRCUIT
φCLK
Vdd
Q11
Q12
Q13
Q14
Q15
R1
R2
φrs
30
Vfd
Vrd
34
OG
φ2
N-
N
N-
N+
N
N+
Pwell
31
32
33
100

F I G. 13
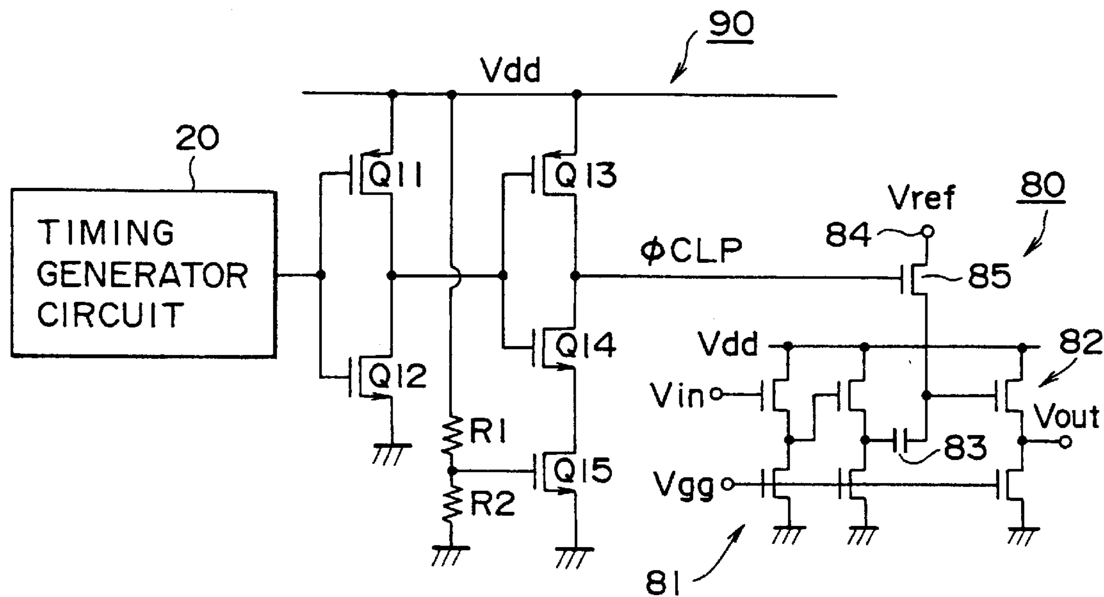
F I G. 14
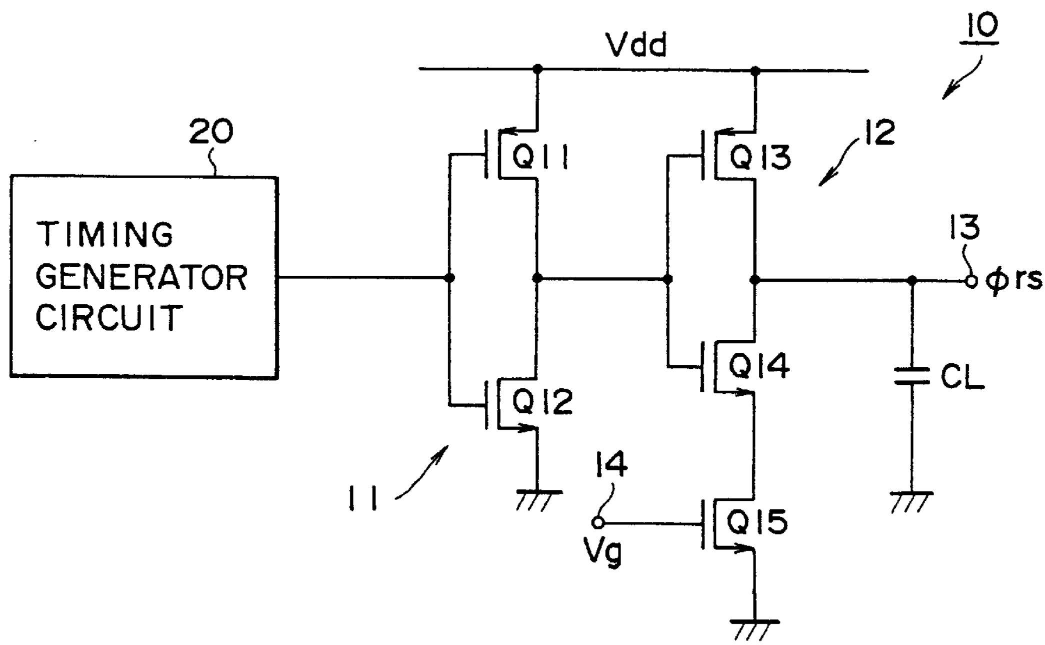

F I G. 15
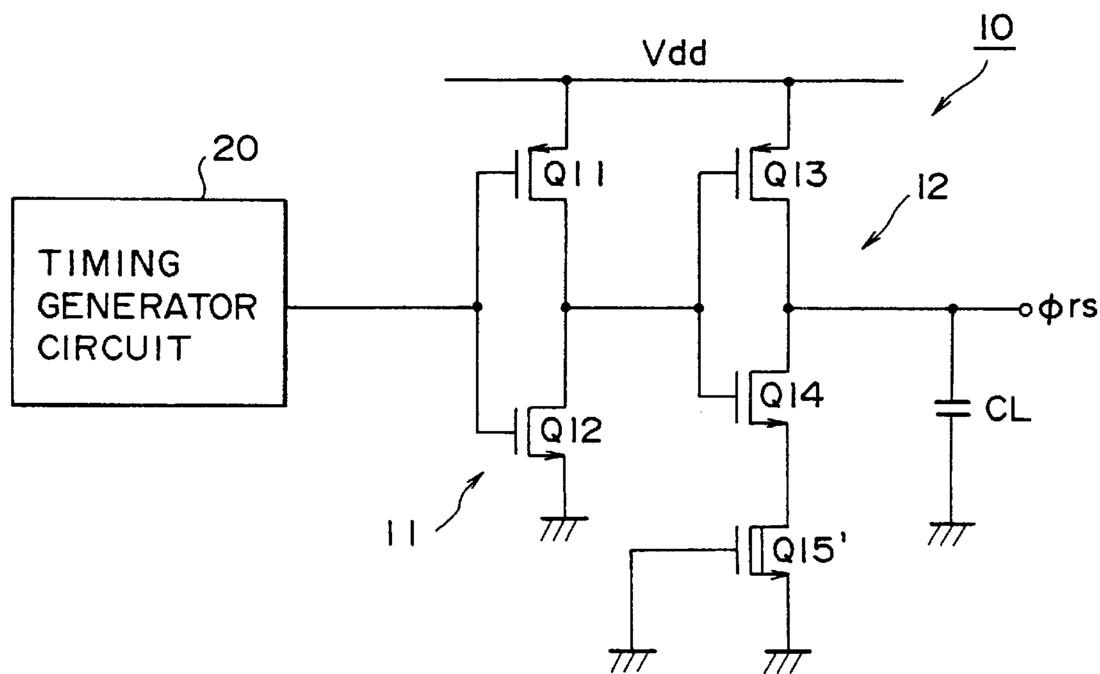
F I G. 16
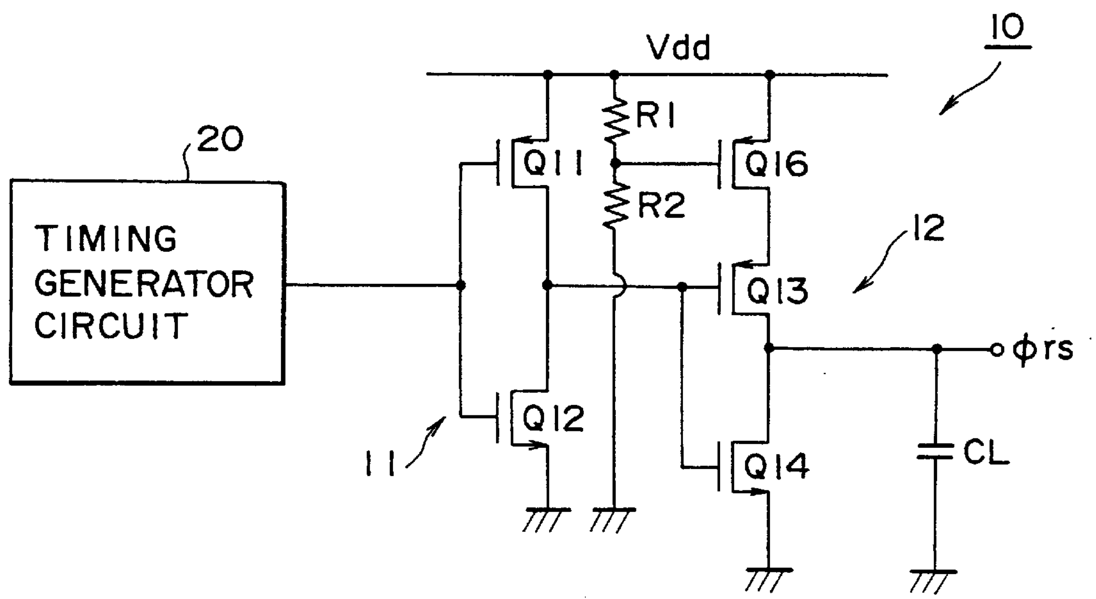

182
AD CONVERTER
AD TIMING PULSE
Vout
181
180
170
178
177
175
Vfd
173
172
φrs
CHARGE TRANSFER REGISTER
DRIVER
TIMING GENERATOR CIRCUIT
Vdd
φ2
179
φCLK
SENSOR ROW
φ1
176
φROG
171
174

ΦCLK
177
TIMING GENERATOR CIRCUIT
178
Φrs DRIVER
OTHER DRIVERS (ΦSH, ETC.)
Φ2 DRIVER
Φ1 DRIVER
175
Φ2
OG
Φrs
186
N-
N
N-
N+
N
N+
Pwell
183
184
185
Vfd
Vrd
Vdd
Vgg
187
180
ΦSH
186
Vout φrs COUPLING
Vout
AD TIMING PULSE
TIME t [S]
VOLTAGE [V]

Vout
S/H COUPLING
AD TIMING PULSE
TIME t [S]
VOLTAGE [V]

OG
Vfd
φrs
Vrd
N-
N+
N
N+
φrs COUPLING & NOISE
SIGNAL CHARGE
t1
t2
t3

SWITCHING CIRCUIT AND CHARGE TRANSFER DEVICE USING SAME

BACKGROUND OF THE INVENTION

The present invention relates to a switching circuit and a charge transfer device using such a circuit in a portion of its output circuit.

FIG. 17 shows a structure of a solid-state image sensing apparatus such as a CCD linear sensor, and FIG. 18 shows a structure of the periphery of a charge voltage converter. First, a CCD linear sensor 170 comprises a sensor row 172 consisting of a multiplicity of sensor elements 171 (corresponding to, e.g., 2000 pixels) which are arrayed in a row to convert incident light into a signal charge of an amount proportional to the light quantity and store the signal charge therein, a read gate 173 for reading out the signal charge stored in each of the sensor elements 171 of the sensor row 172, and a charge transfer register 174 consisting of CCDs to unidirectionally transfer the signal charge read out by the read gate 173. The charge transfer register 174 is equipped with, at an end thereof, a charge-voltage converter 175 for detecting the transferred signal charge and converting such charge into a proportional voltage.

The read gate 173 is driven by a read gate pulse øROG applied thereto via a terminal 176. The charge transfer register 174 is driven by two-phase driving pulses ø1 and ø2 generated by a timing generator circuit 177 and applied via a driver 178. The charge-voltage converter 175 is reset by a reset pulse ørs generated similarly by the timing generator circuit 177 and applied via the driver 178. The timing generator circuit 177 generates various timing signals, such as two-phase driving pulses ø1, ø2 and a reset pulse ørs, in response to clock pulses øCLK inputted thereto via a terminal 179. An output voltage $V_{fd}$ from the charge-voltage converter 175 is first supplied to a buffer 181 and then is delivered therefrom as a CCD output voltage $V_{out}$ via an output terminal 181. Subsequently the voltage $V_{out}$ is converted into a digital signal by an AD converter 182 in accordance with an AD timing pulse.

In FIG. 18, the charge-voltage converter 175 is constructed as a floating diffusion amplifier which consists of a floating diffusion (FD) 184 composed of N+ type impurity and formed adjacently to the output gate 183 which is composed of N− type impurity and constitutes the final stage of the charge transfer register 174, a reset drain (RD) 185 composed of N+ type impurity and formed via a channel region of N type impurity, and a reset gate (RG) 186 disposed above the channel region, wherein the signal charge transferred from the output gate 183 to the floating diffusion 184 is converted into a voltage $V_{fd}$ and then is outputted. A predetermined voltage (e.g., supply voltage $V_{dd}$) is applied as a reset drain voltage $V_{rd}$ to the reset drain 185. Meanwhile the aforementioned reset pulse ørs is applied to the reset gate 186.

FIG. 19 shows a general output waveform of the CCD output voltage $V_{out}$ obtained when none of sample and hold action (S/H) is performed in the buffer 180. As obvious from this output waveform, when a reset pulse ørs applied to the reset gate 186 is turned off, there occurs a ørs coupling which signifies a potential variation caused in the floating diffusion 184 due to capacitive coupling derived from a parasitic capacitance between the reset drain 185 and the reset gate 186. Supposing now that the CCD output voltage $V_{out}$ has an amplitude of $1V_{p-p}$, if the ørs coupling is 0.5V, it follows that a voltage of 1.5V or more needs to be ensured for the operating region of the output circuit in consideration of some amplitude variation of the ørs coupling (derived from variations in manufacture and ambient environment in use). In view of the above situation, it is essential to reduce the ørs coupling for facilitating design of the output circuit.

FIG. 20 shows an output waveform of the CCD output voltage $V_{out}$ obtained when a sample holding action is performed in the buffer 180. Although the entire amplitude of the CCD output voltage $V_{out}$ is also reduced by such a sample holding action, it becomes necessary to take the ørs coupling into consideration in designing a front stage 187 of the sample hold circuit 186 (consisting of two source-follower stages in this example), as obvious from the circuit diagram of FIG. 18. Further when CDS (correlated double sampling) or the like is to be executed for elimination of noise, the circuit configuration anterior to the sample hold circuit 186 is complicated since such CDS needs to be performed prior to the sample holding action. And the more complicate the circuit configuration is rendered, there exist greater difficulties in designing a large operating region.

Another problem existing with regard to the ørs coupling relates to noise. One of noises included in the CCD output voltage $V_{out}$ is random noise which is termed reset noise in a broad sense. The reset noise is classified into resistance noise in its narrow sense, distribution noise caused when the charge under the gate is distributed to the floating diffusion at turn-off of the reset gate 186, and coupling noise caused by variation of the ørs coupling derived from capacitive coupling. Here, distribution noise and coupling noise are dependent on the reset pulse ørs.

The distribution noise raises a problem relative to distribution of the charge on a channel or to a transfer time to the drain at (or immediately after) turn-off of a transistor (MOS transistor consisting of floating diffusion 184, reset drain 185 and reset gate 186) in the reset gate. If the mutual conductance $g_m$ of the MOS transistor is sufficiently high, the distribution noise changes depending on its turn-off speed. And this noise becomes larger in accordance with increase of the speed. The speed is determined on the basis of the value obtained by dividing the amplitude of the ørs coupling by the fall time of the reset pulse ørs.

As for the coupling noise, some influence is derived from the impedance due to wiring and so forth to the reset drain 185 supplied normally with the source voltage $V_{dd}$ and also from the MOS transistor in the reset gate, and the coupling noise is dependent on the fall speed of the rest pulse ørs. More specifically, when the impedance is high, the coupling is increased by the parasitic capacitance between the reset drain 185 and the reset gate 186, whereby the noise is also increased. To the contrary, when the fall speed of the reset pulse ørs is low, the coupling is reduced by the influence from the impedance and the MOS transistor in the reset gate. To realize reduction of the coupling itself is significant in view of both design and performance, as described.

For reduction of the coupling, there are the following means. First, FIG. 21 is a circuit diagram of a fundamental ørs driver. This ørs driver comprises a first-stage C-MOS inverter 211 consisting of a P-MOS transistor M1 and an N-MOS transistor M2 connected between a power supply $V_{dd}$ and the ground, a second-stage C-MOS inverter 212 consisting of a P-MOS transistor M3 and an N-MOS transistor M4 connected between the power supply $V_{dd}$ and the ground similarly to the above, and a load capacitor CL connected between an output line 213 and the ground. In contrast with the ørs driver having such a circuit configuration, the present example is so contrived as shown in FIG. 22 for realizing reduction of the coupling, wherein the source of an N-MOS transistor M4 in a second-stage C-MOS inverter 212 is connected to a power supply $V_{cc}$. The output voltage of this power supply $V_{cc}$ is intermediate between the voltage of the power supply $V_{dd}$ and the ground level.

FIGS. 23A and 23B show waveforms of reset pulses ørs and CCD outputs $V_{out}$, respectively, in the circuit examples 1 and 2 of FIGS. 21 and 22. And FIG. 24 shows cross-section potentials in the vicinity of a floating diffusion (FD) at time points t1, t2 and t3 in FIGS. 23A and 23B. According to the circuit example 2 of FIG. 22, the low level of the reset pulse ørs is set to be higher than that in the circuit example 1 of FIG. 21 as denoted by a single-dot chained line in FIG. 23A, so that the amplitude of the reset pulse ørs itself can be diminished, whereby the coupling to the output $V_{fd}$ of the floating diffusion is also reducible correspondingly thereto, as obvious from FIG. 23B. However, if the amplitude of the reset pulse ørs is diminished extremely, it becomes impossible to sufficiently ensure the dynamic range of the floating diffusion. Therefore, in the related art mentioned above, there exists some restriction in diminishing the amplitude of the reset pulse ørs to a certain degree to consequently limit the reduction of the coupling as well.

SUMMARY OF THE INVENTION

It is an object of the present invention to provide a switching circuit capable of certainly reducing any unrequired coupling portion in an output waveform, and also to provide a charge transfer device using such a switching circuit.

According to one aspect of the present invention, there is provided a switching circuit comprising a holding means to hold a signal or a DC component thereof, and a switching transistor for driving the holding means, wherein a means is further included for blunting a waveform transition of a driving pulse applied to the gate of the switching transistor at the time of turning off the same, i.e., for shaping the trailing edge to be more obtuse in the fall of the driving pulse.

And according to another aspect of the present invention, there is provided a charge transfer device comprising a charge transferrer for transferring a signal charge, a charge-voltage converter for converting the signal charge transferred thereto by the charge transferrer into a proportional voltage, and a driver for supplying a reset pulse to the charge-voltage converter so as to reset the capacitance thereof to a predetermined potential, wherein another means is incorporated in the driver for blunting a waveform transition of the reset pulse at the time of turning off the transistor, i.e., for shaping the trailing edge to be more obtuse in the fall of the reset pulse.

When a driving pulse is applied to the switching transistor in the switching circuit of the above structure, the means for holding a signal or a DC component thereof is reset to a predetermined potential or is clamped to another predetermined potential. And at the time of turning off the switching transistor, the coupling portion derived from capacitive coupling is reduced since the trailing edge of the driving pulse is rendered more obtuse.

In the charge transfer device of the above structure where a reset pulse is applied to the charge-voltage converter, either a floating diffusion or a floating gate is reset to a predetermined potential. And since the trailing edge of the reset pulse at the time of turning off the reset is rendered more obtuse, it becomes possible to reduce the coupling portion of the output waveform where the potential of the floating diffusion or the floating gate is varied by the capacitive coupling which is derived from the parasitic capacitance between a reset drain and a reset gate.

The above and other features and advantages of the present invention will become apparent from the following description which will be given with reference to the illustrative accompanying drawings.

BRIEF DESCRIPTION OF THE DRAWINGS

FIG. 6 is a circuit diagram showing another modification of the first embodiment;

FIG. 7 is a circuit diagram showing a second embodiment of the present invention;

FIG. 8 is a block diagram showing an application 1 of the second embodiment;

FIG. 13 is a circuit diagram showing an application 4 of the second embodiment;

FIG. 14 is a circuit diagram showing amodification 1 of the second embodiment;

FIG. 15 is a circuit diagram showing a modification 2 of the second embodiment;

FIG. 16 is a circuit diagram showing a modification 3 of the second embodiment;

DESCRIPTION OF THE PREFERRED EMBODIMENTS

Hereinafter some embodiments of the present invention will be described in detail with reference to the accompanying drawings.

Figure 1:
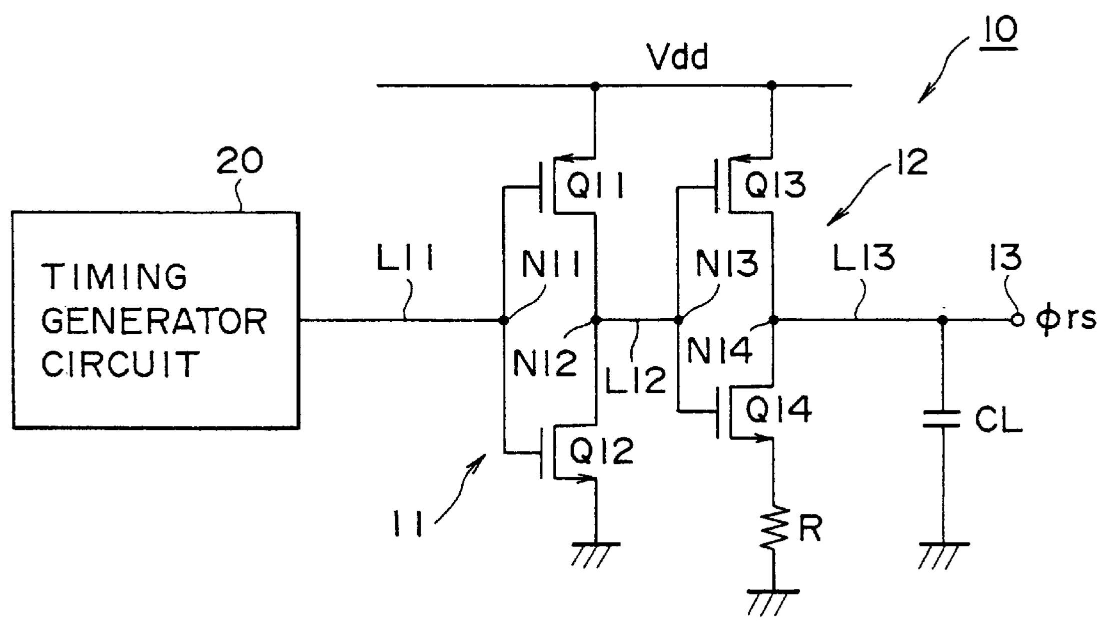
FIG. 1 is a circuit diagram showing a first embodiment of the present invention.

FIG. 1 is a circuit diagram showing a first embodiment of the present invention. In this diagram, a P-MOS transistor Q11 and an N-MOS transistor Q12 are so arranged that respective gates and drains are mutually connected, and a source of the P-MOS transistor Q11 is connected to a power supply $V_{dd}$ while a source of the N-MOS transistor Q12 is grounded to thereby constitute a first-stage C-MOS inverter 11. The gate node N11 of the P-MOS transistor Q11 and the N-MOS transistor Q12 is connected via a signal line L11 to an output terminal of a timing generator circuit 20.

A P-MOS transistor Q13 and an N-MOS transistor Q14 are so arranged that respective gates and drains are mutually connected, and a source of the P-MOS transistor Q13 is connected to the power supply $V_{dd}$ while a source of the N-MOS transistor Q14 is grounded via a resistor R to thereby constitute a second-stage C-MOS inverter 12. The gate node N13 of the P-MOS transistor Q13 and the N-MOS transistor Q14 is connected via a signal line L12 to the drain node N12 of the P-MOS transistor Q11 and the N-MOS transistor Q12. The drain node N14 of the P-MOS transistor Q13 and the N-MOS transistor Q14 is connected via a signal line L13 to the output terminal 13. And a load capacitor CL is connected between the signal line L13 and the ground.

Figure 2:
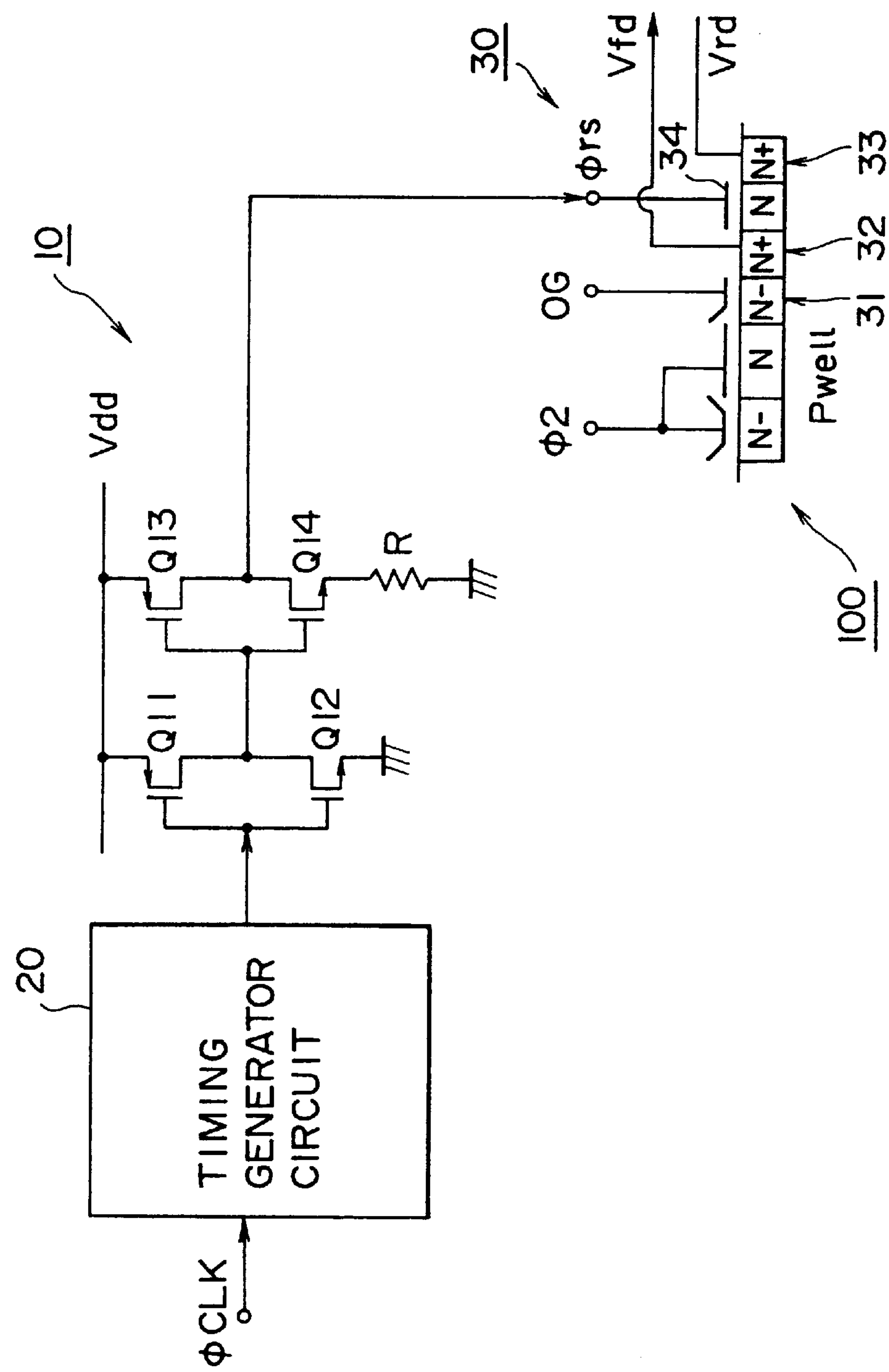
FIG. 2 is a block diagram showing an application of the first embodiment.

FIG. 2 is a block diagram showing an application of a switching circuit which is represented by the first embodiment of the above structure. In this application, the switching circuit of the first embodiment is used as a ørs driver 10 for driving a reset gate of a charge-voltage converter which is constructed as, e.g., a floating diffusion amplifier in a charge transfer device 100 such as a charge transfer register or a CCD delay device in a solid-state image sensing apparatus inclusive of a CCD linear sensor or a CCD area sensor. The charge-voltage converter for converting a signal charge into a proportional voltage is not limited merely to a floating diffusion amplifier construction alone, and it may be a floating gate construction as well.

In FIG. 2, the charge-voltage converter 30 has a switching transistor (MOS transistor) structure which comprises a floating diffusion 32 of N+ type impurity formed adjacent to an output gate 31 of N− type impurity constituting the final stage of a charge transferrer, a reset drain 33 of N+ type impurity formed via a channel region of N type impurity, and a reset gate 34 disposed above the channel region, wherein the signal charge transferred from the output gate 31 to the floating diffusion 32 is converted into a voltage $V_{fd}$ and then is delivered as an output. The capacitance (stray capacitance) of the floating diffusion 32 corresponds to the load capacitor CL shown in FIG. 1. A predetermined voltage (e.g., supply voltage $V_{dd}$) is applied as a reset drain voltage $V_{rd}$ to the reset drain 33. And a reset pulse ørs is applied from the ørs driver 10 to the reset gate 34.

Figure 3A:
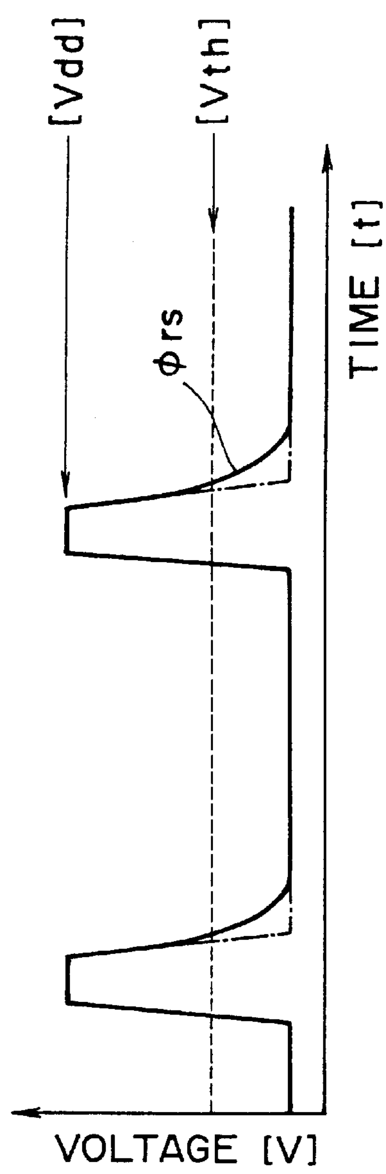
FIGS. 3A and 3B are waveform charts related to the first embodiment.
Figure 3B:
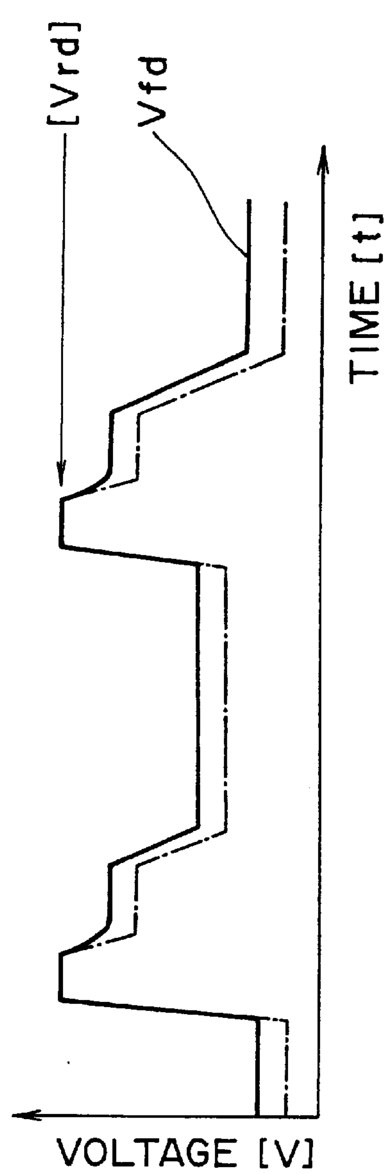

As described above, in the ørs driver 10 for driving the reset gate 34 of the charge-voltage converter 30, a resistor R is connected between the ground and the source of the N-MOS transistor Q14 in the second-stage C-MOS inverter 12, so that the fall time of the reset pulse ørs applied to the reset gate 34 is prolonged as indicated by a solid line in FIG. 3A, whereby the trailing edge of the reset pulse ørs can be rendered more obtuse. Accordingly, the high-frequency component can be eliminated in the fall of the reset pulse ørs and, as obvious from FIG. 3B, it becomes possible to reduce the coupling portion of the waveform caused by the capacitive coupling which is derived from the parasitic capacitance between the reset drain 33 and the reset gate 34 during the fall time of the reset pulse ørs. Thus, remarkable effect of reducing the coupling to the output $V_{fd}$ of the floating diffusion 32 can be achieved by an extremely simple circuit configuration with mere addition of single resistor R.

Figure 4:
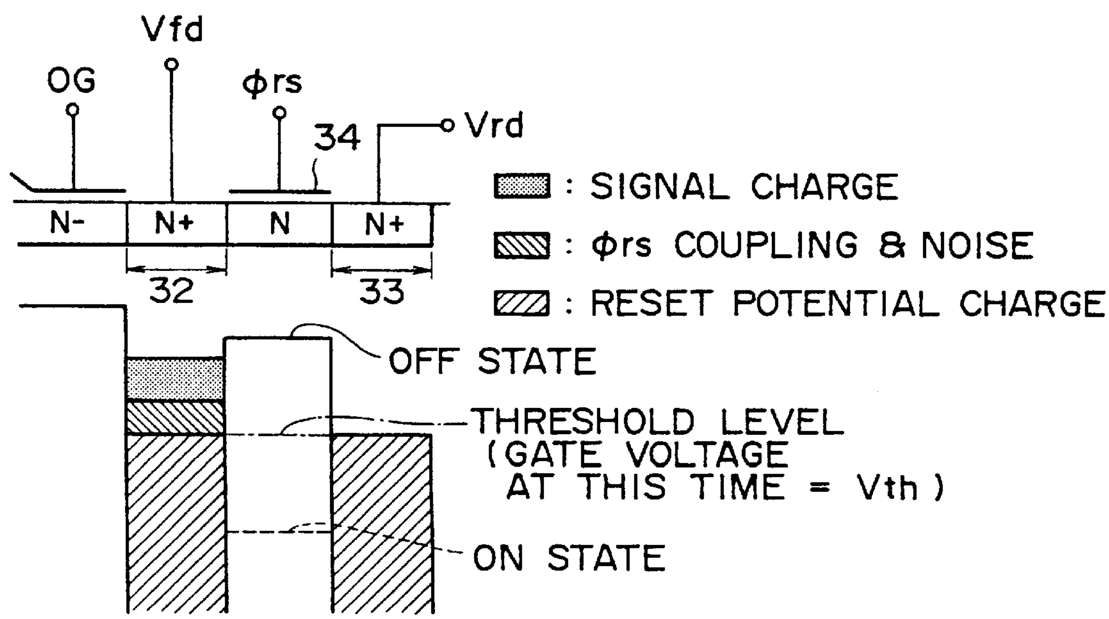
FIG. 4 shows cross-section potentials in a floating diffusion.

FIG. 4 shows cross-section potentials of the floating diffusion. In this diagram, out of the potentials under the reset gate 34, the one denoted by a single-dot chained line is an on/off threshold level of the reset gate 34. Practically, due to the coupling, a slightly higher potential corresponds to the threshold level. However, for the purpose of simplifying the explanation, it is assumed here that a potential equal to the reset drain voltage $V_{rd}$ is regarded as the threshold level. The reset gate voltage obtained when the potential becomes equal to the level $V_{rd}$ is the threshold level $V_{th}$, and this corresponds to a dotted line traversing the waveform of the reset pulse ørs shown in FIG. 3A. Therefore, in the waveform of the reset pulse ørs, the slope at the intersection with the threshold level $V_{th}$ is the important fall speed portion concerned with the noise.

Figure 5:
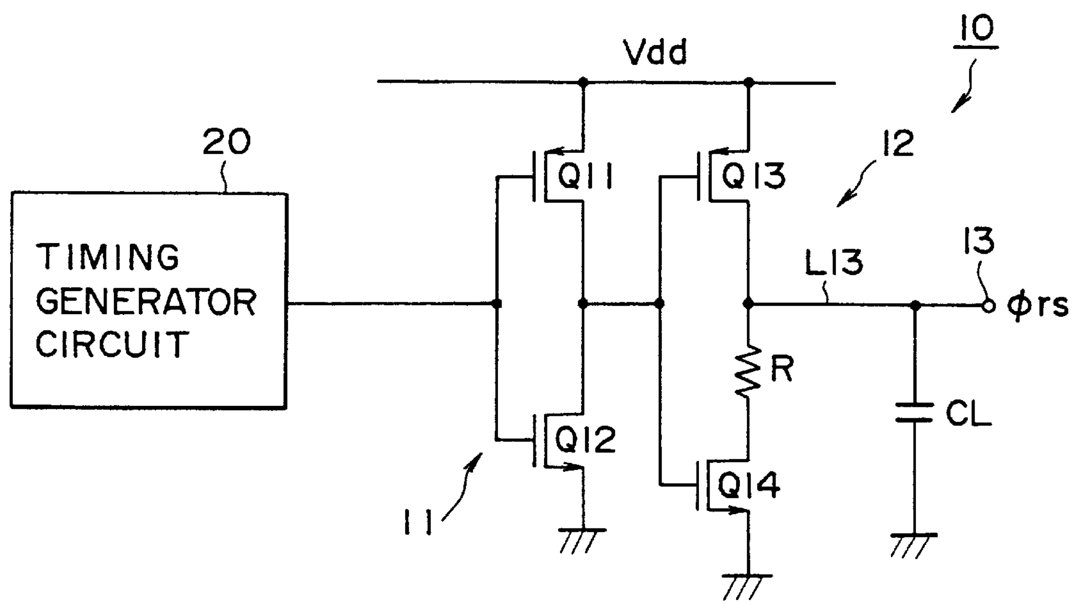
FIG. 5 is a circuit diagram showing a modification of the first embodiment.

FIG. 5 is a circuit diagram showing a modification of the first embodiment, wherein circuit components corresponding to those in FIG. 1 are denoted by like reference numerals or symbols. In this modification, a resistor R is connected between a signal line L13 and a drain of an N-MOS transistor Q14 in a second-stage C-MOS inverter 12. Also in this modification where the resistor R is connected in series to the N-MOS transistor Q14, the fall time of the reset pulse ørs can be prolonged similarly to the aforementioned case of the first embodiment, so that it becomes possible to reduce the coupling to the output $V_{fd}$ of a floating diffusion 32.

FIG. 6 is a circuit diagram showing another modification of the first embodiment, wherein circuit components corresponding to those in FIG. 1 are denoted by like reference numerals or symbols. In this modification, a resistor R is connected between a load capacitor CL and a node N14 of a drain of a second-stage C-MOS inverter 12. In the case of this modification, the rise time of the reset pulse ørs is also prolonged as well as the fall time thereof, but since the coupling is induced at the fall time of the reset pulse ørs, the coupling to the output $V_{fd}$ of a floating diffusion 32 can be reduced without impediment even if the rise time is rendered longer.

The first embodiment and the modification thereof mentioned above are so constituted as to shape the trailing edge more obtuse in the fall of the reset pulse ørs by additionally connecting a resistor R. And it is also possible to achieve further reduction of the ørs coupling by a combination with another technique that diminishes the amplitude of the reset pulse ørs itself by setting the source potential of the N-MOS transistor Q14 in the second-stage C-MOS inverter 12 not to the ground level but to a potential level $V_{cc}$ which is higher than the ground level but is lower than the voltage level of the power supply $V_{dd}$.

FIG. 7 is a circuit diagram showing a second embodiment of the present invention, wherein circuit components corresponding to those in FIG. 1 are denoted by like reference numerals or symbols. In this diagram, a P-MOS transistor Q11 and an N-MOS transistor Q12 are so arranged that respective gates and drains are mutually connected, and a source of the P-MOS transistor Q11 is connected to a power supply $V_{dd}$ while a source of the N-MOS transistor Q12 is grounded to thereby constitute a first-stage C-MOS inverter 11. The gate node N11 of the P-MOS transistor Q11 and the N-MOS transistor Q12 is connected via a signal line L11 to an output terminal of a timing generator circuit 20.

A P-MOS transistor Q13 and an N-MOS transistor Q14 are so arranged that respective gates and drains are mutually connected, and a source of the P-MOS transistor Q13 is connected to the power supply $V_{dd}$ while a source of the N-MOS transistor Q14 is grounded via an N-MOS transistor Q15 to thereby constitute a second-stage C-MOS inverter 12. A gate of the N-MOS transistor 15 is connected to a node N15 of resistors R1 and R2 connected in series between the power supply $V_{dd}$ and the ground. More specifically, a predetermined voltage obtained by dividing the voltage of the power supply $V_{dd}$ by the resistance ratio of the resistors R1 and R2 is applied to the gate of the N-MOS transistor Q15. The N-MOS transistor Q15 and the resistors R1 ad R2 are produced on the same substrate where the other circuit component elements are also mounted (on-chip).

In the second-stage C-MOS inverter 12, the gate node N13 of the P-MOS transistor Q13 and the N-MOS transistor Q14 is connected via a signal line L12 to the drain node N12 of the P-MOS transistor Q11 and the N-MOS transistor Q12. The drain node N14 of the P-MOS transistor Q13 and the N-MOS transistor Q14 is connected via a signal line L13 to the output terminal 13. And a load capacitor CL is connected between the signal line L13 and the ground.

The switching circuit of the second embodiment having the above structure is used as a ørs driver 10 for driving a reset gate of a charge-voltage converter which is constructed as, e.g., a floating diffusion amplifier in a charge transfer device 100 such as a charge transfer register or a CCD delay device in a solid-state image sensing apparatus inclusive of a CCD linear sensor or a CCD area sensor, as in the aforementioned case of the first embodiment. FIG. 8 is a block diagram showing the structure of its exemplary application. A charge-voltage converter 30 is exactly the the same in construction as that in the example of FIG. 2. The charge-voltage converter 30 is not limited merely to a floating diffusion amplifier construction alone, and it may be a floating gate construction as well.

Figure 9A:
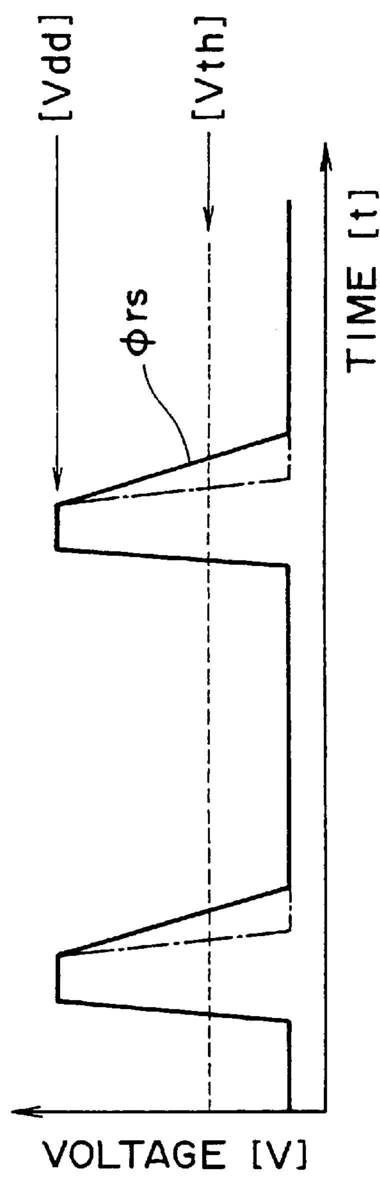
FIGS. 9A and 9B are waveform charts related to the application 1 in FIG. 8.

As described above, in the ørs driver 10 for driving the reset gate 34 of the charge-voltage converter 30, the N-MOS transistor Q15 is connected between the ground and the source of the N-MOS transistor Q14 in the second-stage C-MOS inverter 12, and a predetermined voltage is applied to the gate of the N-MOS transistor Q15, so that this transistor Q15 functions as a constant current source, whereby the fall time alone of the reset pulse ørs can be controlled as indicated by a solid line in FIG. 9A, and such control can be so performed as to attain linear fall.

Figure 9B:
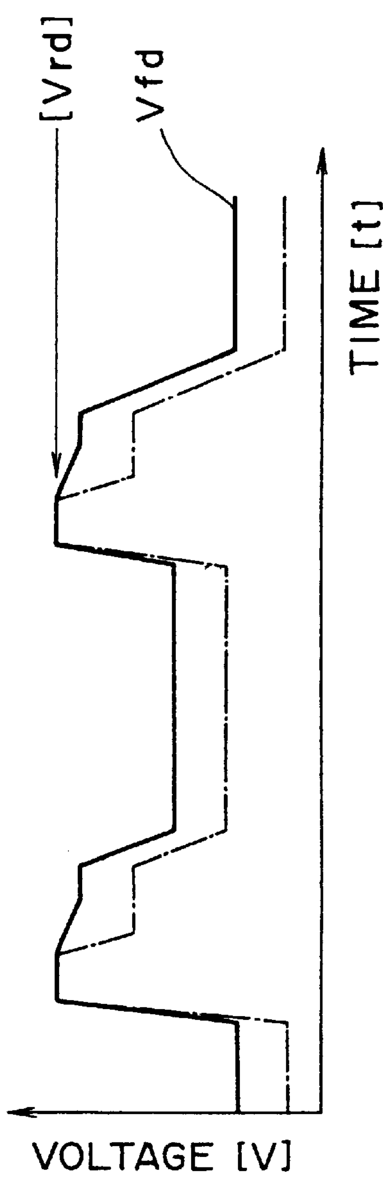

Thus, as obvious from FIG. 9B, it is rendered possible, by shaping the trailing edge more obtuse in the fall of the reset pulse ørs, to reduce the coupling portion of the waveform caused by the capacitive coupling which is derived from the parasitic capacitance between the reset drain 33 and the reset gate 34 during the fall time (turn-off time) of the reset pulse ørs. And despite occurrence of any variation in the threshold level $V_{th}$, the fall slope of the reset pulse ørs can be maintained constant, so that the coupling and the noise are not changed by such variation in the threshold level $V_{th}$.

Consequently, the signal level (operating point) can be judged with facility due to reduction of the coupling portion of the reset pulse ørs in the CCD output waveform, thereby simplifying design of the output circuit connected posterior to the floating diffusion 32. Further, it is rendered possible to set a desired fall speed in the fall of the reset pulse ørs by adjusting the gate voltage of the N-MOS transistor Q15 or adjusting the channel length or width of the N-MOS transistor Q15.

Figure 10:
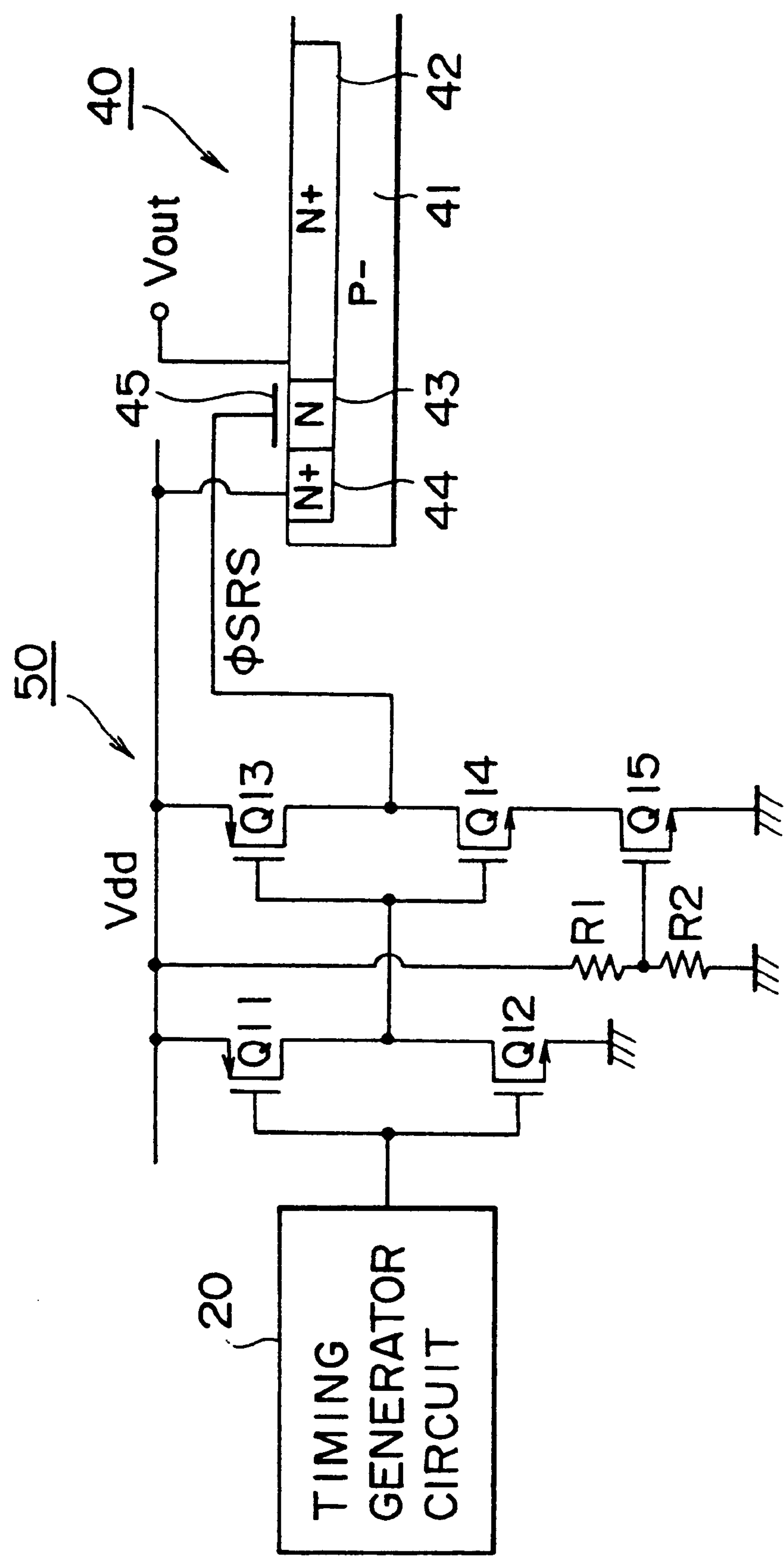
FIG. 10 is a block diagram showing an application 2 of the second embodiment.

FIG. 10 is a block diagram showing an exemplary application of the second embodiment employed for resetting a diode sensor used as an auto-focus monitor sensor (exposure sensor), wherein circuit components corresponding to those in FIG. 8 are denoted by like reference numerals or symbols. In FIG. 10, a diode sensor 40 has a kind of switching transistor (MOS transistor) structure which comprises an N+ type impurity region 42 formed on the obverse side of a P− type impurity region 41, an N+ type impurity region 44 formed beside the N+ type impurity region 42 via an N type impurity region 43, and a reset gate 45 disposed above the N type impurity region 43, wherein the N+ type impurity region 44 is connected to a power supply $V_{dd}$, and a reset pulse øSRS is applied to the reset gate 45.

Figure 11:
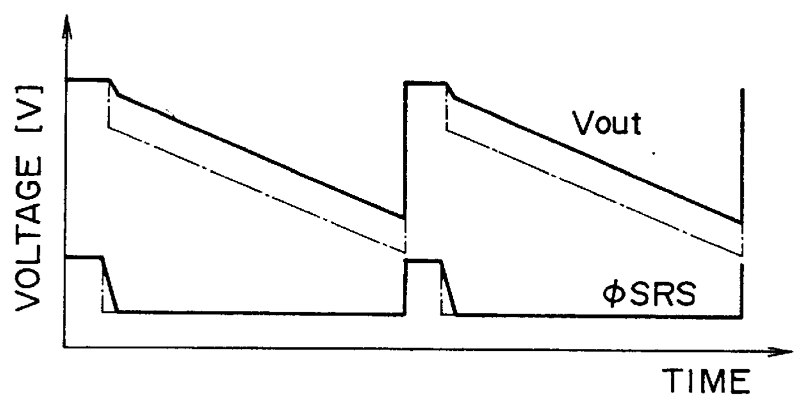
FIG. 11 is a waveform chart related to the application 2 in FIG. 10.

Thus, by applying the switching circuit of the second embodiment to a øSRS driver 50 for resetting the diode sensor 40, the fall time of a reset pulse øSRS can be prolonged while the fall thereof is linearized as graphically shown in FIG. 11. Therefore it becomes possible to reduce the coupling portion of the waveform caused by the capacitive coupling which is derived from the parasitic capacitance between the N+ type impurity region 44 and the reset gate 45 during the fall time (turn-off time) of the reset pulse øSRS. And despite occurrence of 1 any variation in the threshold level $V_{th}$, the fall slope of the reset pulse øSRS can be maintained constant, so that the coupling and the noise are not changed by such variation in the threshold level $V_{th}$.

Figure 12:
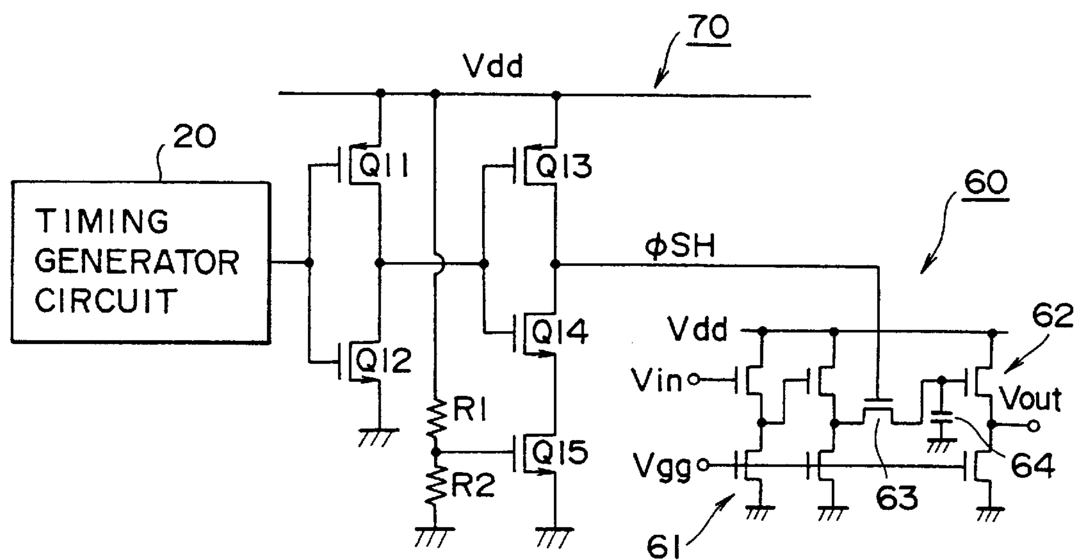
FIG. 12 is a circuit diagram showing an application 3 of the second embodiment.

FIG. 12 is a block diagram showing an exemplary application of the second embodiment employed for driving a sample hold circuit to perform its sampling action, wherein circuit components corresponding to those in FIG. 8 are denoted by like reference numerals or symbols. In FIG. 12, a sample hold circuit 60 comprises a front-stage buffer 61 consisting of two-stage source followers, a rear-stage buffer 62 consisting of one-stage source follower, a hold transistor (N-MOS transistor) 63 serving as a switching transistor whose drain is connected to an output terminal of the buffer 61 and whose source is connected to an input terminal of the buffer 62, and a hold capacitor 64 connected between the source of the hold transistor 63 and the ground, wherein a sample hold pulse øSH is applied to the gate of the hold transistor 63 so that the peak value of an input signal $V_{in}$ is held.

Figure 17:
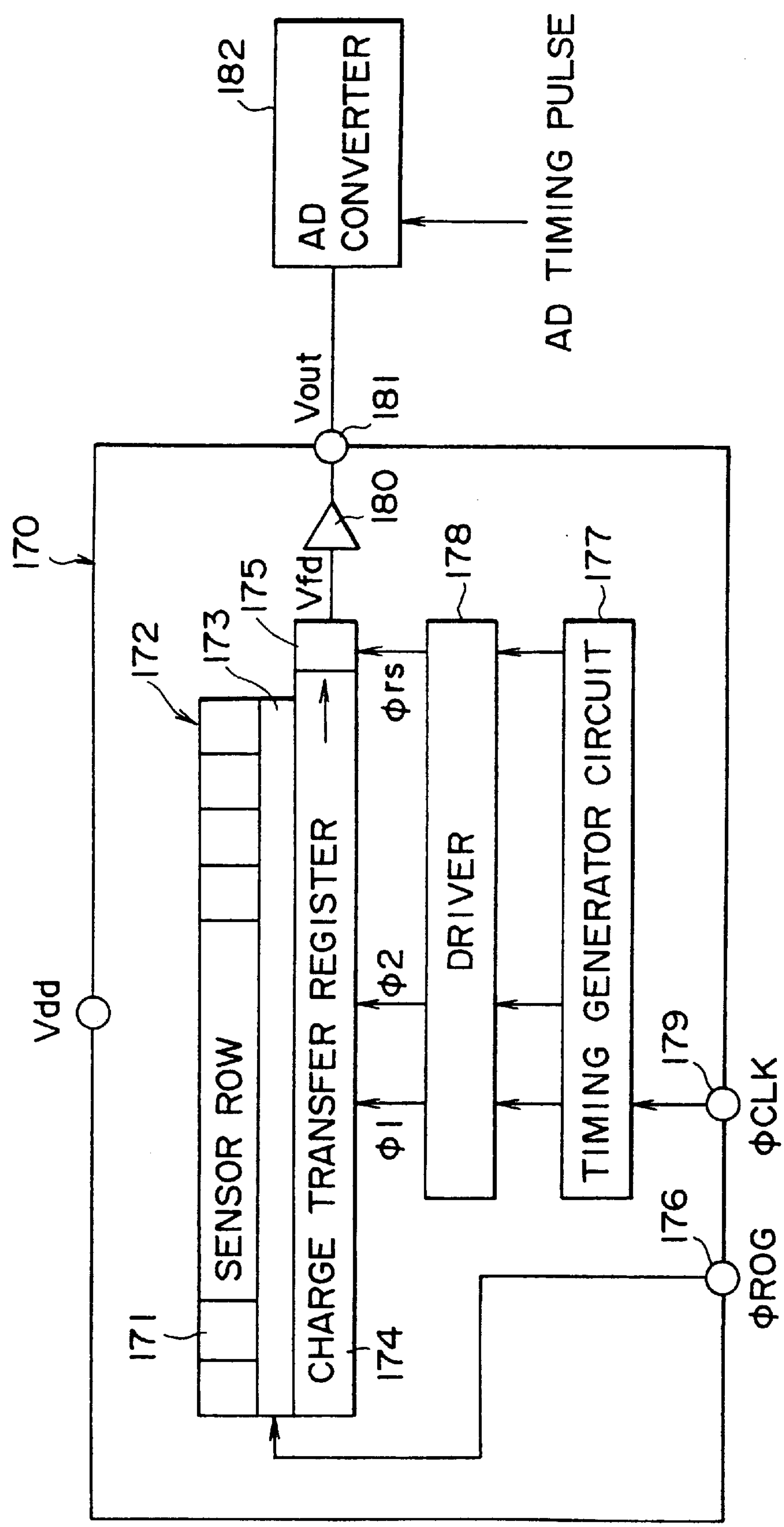
FIG. 17 is a block diagram showing a structure of a CCD linear sensor.
Figure 18:
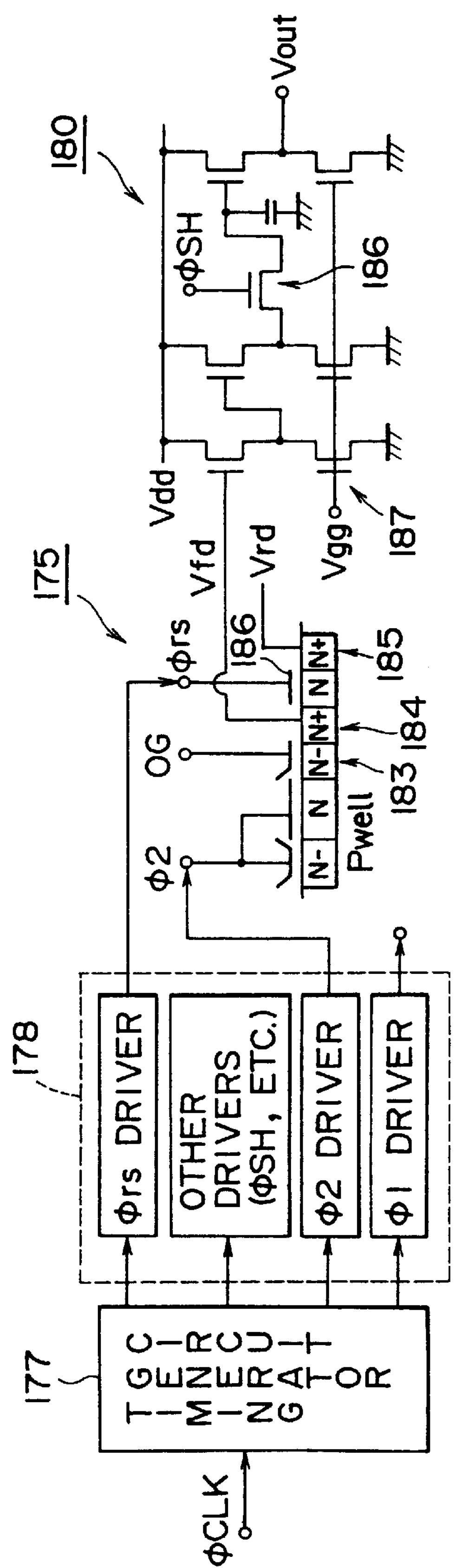
FIG. 18 is a block diagram showing a peripheral 11 structure of a charge-voltage converter.
Figure 19:
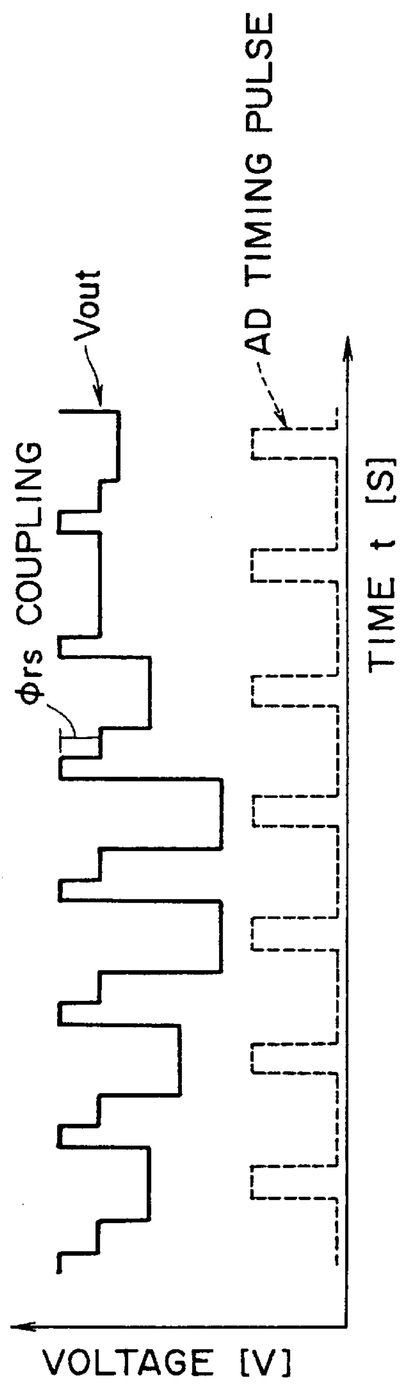
FIG. 19 is a waveform chart of a CCD output obtained without any sample holding action.
Figure 20:
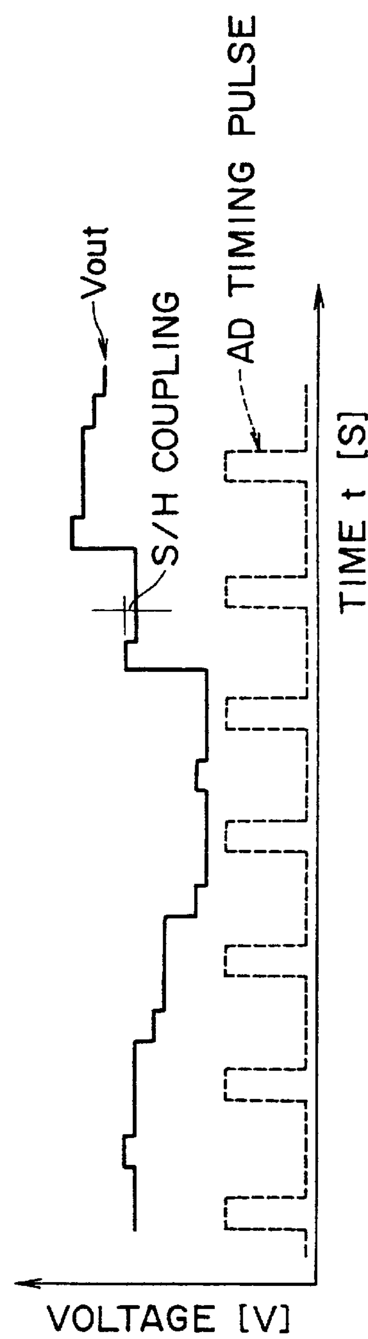
FIG. 20 is a waveform chart of a CCD output obtained with a sample holding action.
Figure 21:
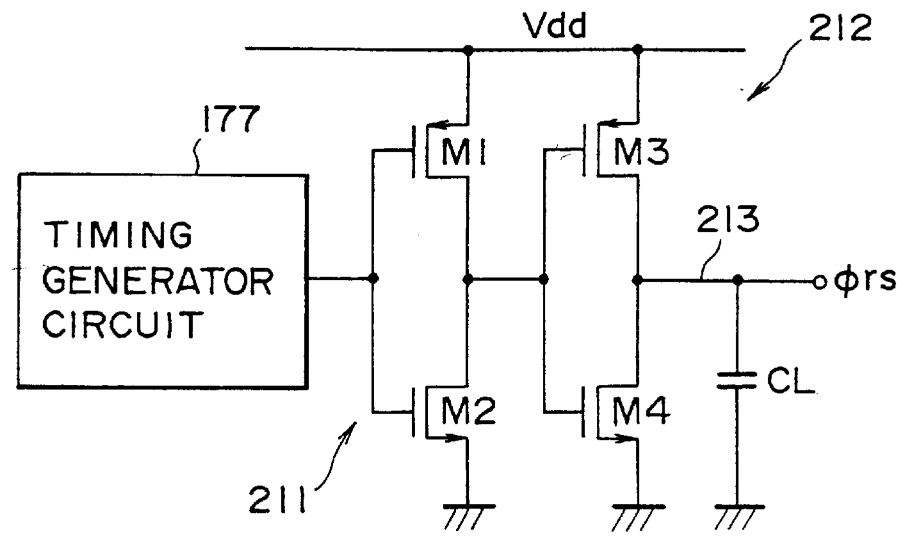
FIG. 21 is a circuit diagram of a conventional circuit example 1 in the related art.
Figure 22:
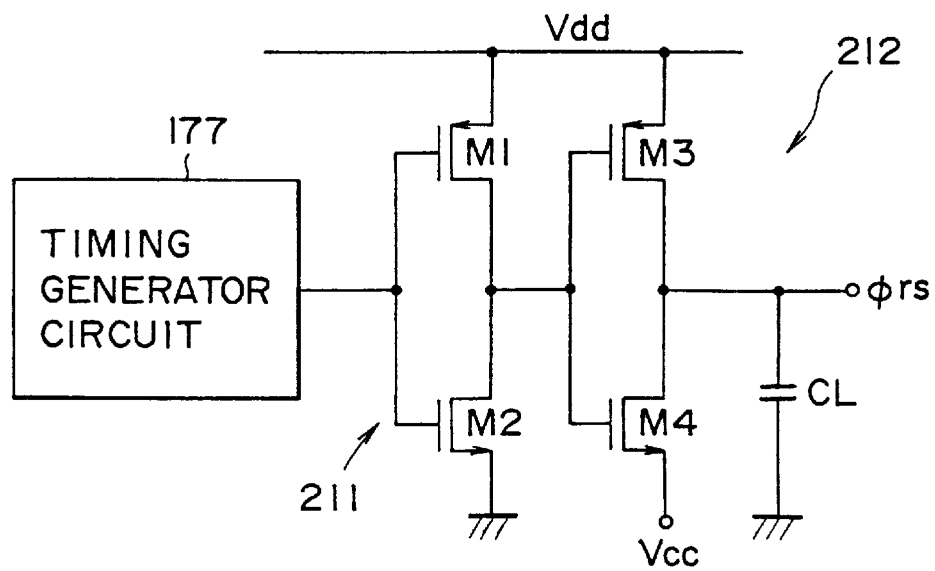
FIG. 22 is a circuit diagram of a conventional circuit example 2 in the related art.
Figure 23A:
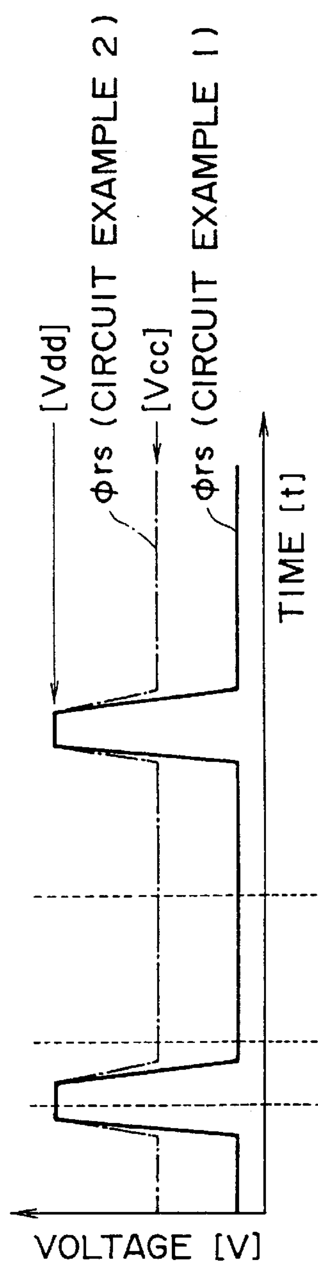
FIGS. 23A and 23B are waveform charts related to the conventional examples.
Figure 23B:
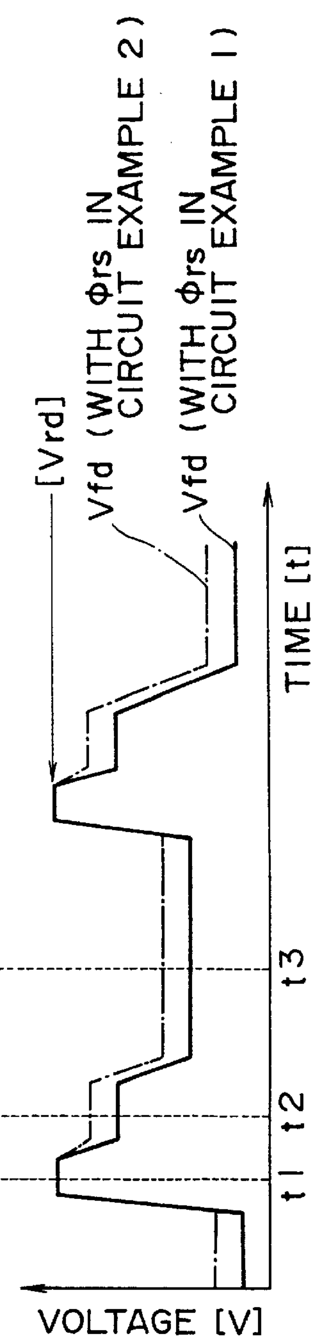
Figure 24:
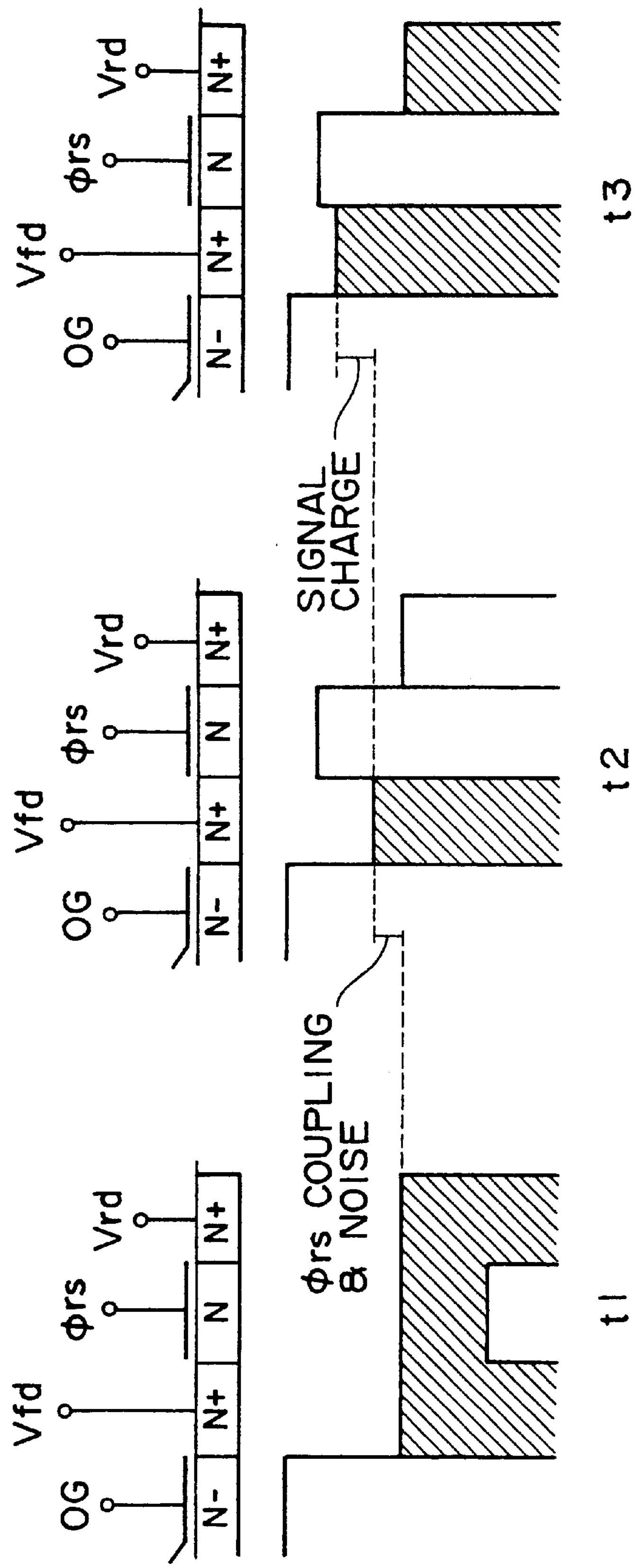
FIG. 24 shows cross-section potentials in the vicinity of a floating diffusion.

By applying the switching circuit of the second embodiment to a øSH driver 70 in this manner for driving the sample hold circuit 60 to perform its sampling action, the fall time of a sample hold pulse øSH can be prolonged while the fall thereof is linearized. Therefore it becomes possible to reduce the coupling portion of the waveform caused during the fall time of the sample hold pulse øSH, hence retaining the output waveform satisfactory with reduction of the S/H coupling. Consequently, due to the use of this sample hold circuit 60 in, e.g., the output circuit of the CCD linear sensor 170 shown in FIG. 17, it is rendered possible to eliminate the necessity of exactly adjusting the timing of the AD converter 182 (FIG. 17) in the rear-stage signal processing, thereby facilitating the design of the circuit.

FIG. 13 is a block diagram showing an exemplary application of the second embodiment employed for driving a clamp circuit, wherein circuit components corresponding to those in FIG. 8 are denoted by like reference numerals or symbols. In FIG. 13, a clamp circuit 80 comprises a front-stage buffer 81 consisting of two-stage source followers, a rear-stage buffer 82 consisting of one-stage source follower, a clamp capacitor 83 whose one end of connected to an output terminal of the buffer 81 and whose other end is connected to an input terminal of the buffer 82, and a clamp transistor (N-MOS transistor) 85 serving as a switching transistor whose drain is connected to a terminal 84 supplied with a reference potential $V_{ref}$ and whose source is connected to the other end of the clamp capacitor 83, wherein a clamp pulse øCLP is applied to the gate of the clamp transistor 85 so that the DC component of the input signal $V_{in}$ is clamped to the reference potential $V_{ref}$.

Thus, by applying the switching circuit of the second embodiment to a øCLP driver 90 for driving the clamp circuit 80, the fall time of a clamp pulse øCLP can be prolonged while the fall thereof is linearized. Therefore it becomes possible to reduce the coupling portion of the waveform caused during the fall of the clamp pulse øCLP. As a result, the deviation of the clamped DC component from the reference potential $V_{ref}$ is to consequently facilitate design of the rear-stage signal processing circuit.

In the second embodiment and the exemplary application thereof mentioned above, the N-MOS transistor Q15 is additionally connected between the ground and the source of the N-MOS transistor Q14 in the second-stage C-MOS inverter 12, and a predetermined potential is applied to the gate of the N-MOS transistor Q15 to thereby shape the trailing edge more obtuse in the fall of the reset pulse ørs. And it is also possible to achieve further reduction of the coupling by a combination with another technique that diminishes the amplitude of the reset pulse ørs, øSRS, the sample hold pulse øSH or the clamp pulse øCLP itself by setting the source potential of the N-MOS transistor Q15 not to the ground level but to a potential level $V_{cc}$ which is higher than the ground level but is lower than the voltage level of the power supply $V_{dd}$.

Further in the second embodiment, the resistors R1 and R2, through which the gate voltage is applied to the N-MOS transistor Q15 connected additionally, are so provided as to form an on-chip structure. However, the fall time of the reset pulse ørs can be externally controlled by a modification where, as shown in FIG. 14, a gate terminal 14 is provided for the N-MOS transistor Q15, and a gate voltage $V_g$ is supplied to the N-MOS transistor Q15 via the gate terminal 14 thereof. It is also possible to externally control the fall time of the reset pulse ørs in a configuration where the resistors R1 and R2 are variable ones disposed outside.

FIG. 15 is a circuit diagram showing another modification of the second embodiment, wherein circuit components corresponding to those in FIG. 7 are denoted by like reference numerals or symbols. In this modification, a depletion type MOS transistor is used as an N-MOS transistor Q15' connected between the ground and the source of an N-MOS transistor Q14 in a second-stage C-MOS inverter 12. The depletion type MOS transistor is such that a drain current flows therein without supply of any voltage to its gate. Since the requisite is merely that the gate of the N-MOS transistor Q15' has the ground level, it is not necessary to provide any exclusive means for generating a gate voltage, and despite occurrence of any variation in the voltage of the power supply $V_{dd}$, the fall time of the reset pulse ørs is not affected by such variation.

FIG. 16 is a circuit diagram showing a further modification of the second embodiment, wherein circuit components corresponding to those in FIG. 7 are denoted by like reference numerals or symbols. In this modification, a P-MOS transistor Q16 is connected between a power supply $V_{dd}$ and the source of a P-MOS transistor Q13 in a second-stage C-MOS inverter 12, and a divided voltage obtained through resistors R1 and R2 is applied to the gate thereof. According to this circuit configuration, only the rise time of the reset pulse ørs is settable to be longer, so that the ørs coupling can be reduced by applying this modification to a case where the transistor to be driven is a P-MOS transistor.

As mentioned, in a switching circuit comprising a holding means to hold a signal or its DC component and a switching transistor for driving the holding means, the present invention is so contrived as to shape the trailing edge more obtuse in the fall of the driving pulse applied to the gate of the switching transistor, thereby reducing the coupling portion of the output waveform derived from capacitive coupling.

Although the present invention has been described hereinabove with reference to some preferred embodiments thereof, it is to be understood that the invention is not limited to such embodiments alone, and a variety of other modifications and variations will be apparent to those skilled in the art without departing from the spirit of the invention.

The scope of the invention, therefore, is to be determined solely by the appended claims.

What is claimed is:

1. A switching circuit comprising:

a holding means for holding a signal or its DC component;

a switching transistor for driving said holding means; and a waveform shaping means for blunting a waveform transition of a driving pulse applied to the gate of said switching transistor at the time of turning off the same, wherein the waveform shaping means comprises a resistor located between a source of an inverter transistor and ground, wherein the inverter transistor has its drain connected to a gate of the switching transistor.

2. A switching circuit comprising:

a holding means for holding a signal or its DC component;

a switching transistor for driving said holding means; and a waveform shaping means for blunting a waveform transition of a driving pulse applied to the gate of said switching transistor at the time of turning off the same, wherein the waveform shaping means comprises a resistor connected between the drain of an inverter transistor and the gate of the switching transistor and wherein the source of the inverter transistor is connected to ground.

3. A switching circuit comprising:

a holding means for holding a signal or its DC component;

a switching transistor for driving said holding means; and a waveform shaping means for blunting a waveform transition of a driving pulse applied to the gate of said switching transistor at the time of turning off the same, wherein the waveform shaping means comprises a resistor connected between the drains of first and second inverter transistors and the gate of the switching transistor and wherein the source of the first inverter transistor is connected to ground and wherein the source of the second inverter transistor is connected to a voltage source.

4. A switching circuit comprising:

a holding means for holding a signal or its DC component;

a switching transistor for driving said holding means; and a waveform shaping means for blunting a waveform transition of a driving pulse applied to the gate of said switching transistor at the time of turning off the same, wherein the waveform shaping means comprises an inverter transistor having a source connected to ground through another transistor which has its gate connected to a voltage source.

5. A charge transfer device comprising:

a charge transferrer for transferring a signal charge;

a charge-voltage converter for converting into a voltage the signal charge transferred thereto by said charge transferrer;

a transistor for resetting the capacitance of said charge-voltage converter to a predetermined potential; and a driver for supplying a reset pulse to said transistor;

wherein said driver has a waveform shaping means for blunting a waveform transition of said reset pulse at the time of turning off said transistor, wherein the waveform shaping means comprises a resistor located between a source of an inverter transistor and ground, wherein the inverter transistor has its drain connected to a gate of the switching transistor.

6. A charge transfer device comprising:

a charge transferrer for transferring a signal charge;

a charge-voltage converter for converting into a voltage the signal charge transferred thereto by said charge transferrer;

a transistor for resetting the capacitance of said charge-voltage converter to a predetermined potential; and a driver for supplying a reset pulse to said transistor;

wherein said driver has a waveform shaping means for blunting a waveform transition of said reset pulse at the time of turning off said transistor, wherein the waveform shaping means comprises a resistor connected between the drain of an inverter transistor and the gate of the switching transistor and wherein the source of the inverter transistor is connected to ground.

7. A charge transfer device comprising:

a charge transferrer for transferring a signal charge;

a charge-voltage converter for converting into a voltage the signal charge transferred thereto by said charge transferrer;

a transistor for resetting the capacitance of said charge-voltage converter to a predetermined potential; and a driver for supplying a reset pulse to said transistor; wherein said driver has a waveform shaping means for blunting a waveform transition of said reset pulse at the time of turning off said transistor, wherein the waveform shaping means comprises a resistor connected between the drains of first and second inverter transistors and the gate of the switching transistor and wherein the source of the first inverter transistor is connected to ground and wherein the source of the second inverter transistor is connected to a voltage source.

8. A charge transfer device comprising:

a charge transferrer for transferring a signal charge;

a charge-voltage converter for converting into a voltage the signal charge transferred thereto by said charge transferrer;

a transistor for resetting the capacitance of said charge-voltage converter to a predetermined potential; and a driver for supplying a reset pulse to said transistor;

wherein said driver has a waveform shaping means for blunting a waveform transition of said reset pulse at the time of turning off said transistor, wherein the waveform shaping means comprises an inverter transistor having a source connected to ground through another transistor which has its gate connected to a voltage source.

* * * * *